ized | | |

United States Patent
Aviram et al.

(10) Patent No.: US 11,041,609 B2
(45) Date of Patent: Jun. 22, 2021

(54) LIGHTING SYSTEMS AND DEVICES WITH CENTRAL SILICONE MODULE

(71) Applicant: Ecosense Lighting Inc., Los Angeles, CA (US)

(72) Inventors: Itzik Aviram, Shedema (IL); Ariel Meir, Brooklyn, NY (US); Noam Meir, Herzliya (IL)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

(21) Appl. No.: 16/400,854

(22) Filed: May 1, 2019

(65) Prior Publication Data

US 2020/0096178 A1    Mar. 26, 2020

Related U.S. Application Data

(60) Provisional application No. 62/681,490, filed on Jun. 6, 2018, provisional application No. 62/665,197, filed on May 1, 2018.

(51) Int. Cl.
| | |
|---|---|
| *F21V 17/08* | (2006.01) |
| *F21V 5/00* | (2018.01) |
| *F21V 5/04* | (2006.01) |
| *F21V 17/10* | (2006.01) |
| *F21Y 103/10* | (2016.01) |
| *F21Y 115/10* | (2016.01) |

(52) U.S. Cl.
CPC ............. *F21V 17/08* (2013.01); *F21V 5/007* (2013.01); *F21V 5/04* (2013.01); *F21V 17/101* (2013.01); *F21Y 2103/10* (2016.08); *F21Y 2115/10* (2016.08)

(58) Field of Classification Search
CPC ........ F21V 17/08; F21V 17/101; F21V 5/007; F21V 5/04
USPC ........................................................ 362/308
See application file for complete search history.

(56) References Cited

U.S. PATENT DOCUMENTS

| | | | |
|---|---|---|---|
| 4,445,164 | A | 4/1984 | Giles, III et al. |
| 4,580,859 | A | 4/1986 | Frano et al. |
| 4,603,496 | A | 8/1986 | Latz |
| 4,727,648 | A | 3/1988 | Savage |
| 4,837,927 | A | 6/1989 | Savage |
| 5,087,212 | A | 2/1992 | Hanami |
| 5,174,649 | A | 12/1992 | Alston |
| 5,241,457 | A | 8/1993 | Sasajima |
| 5,387,901 | A | 2/1995 | Hardt |
| 5,436,809 | A | 6/1995 | Brassier et al. |

(Continued)

FOREIGN PATENT DOCUMENTS

| | | |
|---|---|---|
| CA | 2623604 A | 8/2009 |
| CN | 101592291 A | 12/2009 |

(Continued)

OTHER PUBLICATIONS

International Patent Application No. PCT/US2019/030252; Int'l Search Report and the Written Opinion; dated Oct. 4, 2019; 13 pages.

(Continued)

*Primary Examiner* — Bryon T Gyllstrom
(74) *Attorney, Agent, or Firm* — Jay M. Brown

(57) ABSTRACT

Lighting systems that include an LED and a silicone module designed to contain a lens are described herein.

20 Claims, 4 Drawing Sheets

(56) References Cited

U.S. PATENT DOCUMENTS

| | | |
|---|---|---|
| 5,490,048 A | 2/1996 | Brassier et al. |
| 5,628,557 A | 5/1997 | Huang |
| 5,632,551 A | 5/1997 | Roney et al. |
| 5,658,066 A | 8/1997 | Hirsch |
| 5,821,695 A | 10/1998 | Vilanilam |
| 6,354,714 B1 | 3/2002 | Rhodes |
| 6,426,704 B1 | 6/2002 | Hutchison |
| 6,439,743 B1 | 8/2002 | Hutchison |
| 6,450,662 B1 | 9/2002 | Hutchison |
| 6,450,664 B1 | 9/2002 | Kelly |
| 6,473,002 B1 | 10/2002 | Hutchison |
| 6,474,839 B1 | 11/2002 | Hutchison |
| 6,527,422 B1 | 3/2003 | Hutchison |
| 6,530,674 B2 | 3/2003 | Grierson et al. |
| 6,582,103 B1 | 6/2003 | Popovich |
| 6,590,235 B2 | 7/2003 | Carey |
| 6,601,970 B2 | 8/2003 | Ueda et al. |
| 6,676,284 B1 | 1/2004 | Wynne |
| 6,773,138 B2 | 8/2004 | Coushaine |
| 6,824,296 B2 | 11/2004 | Souza et al. |
| 6,827,469 B2 | 12/2004 | Coushaine et al. |
| 6,880,952 B2 | 4/2005 | Kiraly et al. |
| 6,893,144 B2 | 5/2005 | Fan |
| 6,979,097 B2 | 12/2005 | Elam et al. |
| 7,093,958 B2 | 8/2006 | Coushaine |
| 7,111,964 B2 | 9/2006 | Suehiro |
| 7,132,804 B2 | 11/2006 | Lys et al. |
| 7,150,553 B2 | 12/2006 | English et al. |
| 7,159,997 B2 | 1/2007 | Reo et al. |
| 7,161,311 B2 | 1/2007 | Mueller et al. |
| 7,210,957 B2 | 5/2007 | Mrakovich et al. |
| 7,221,104 B2 | 5/2007 | Lys et al. |
| 7,229,192 B2 | 6/2007 | Mayfield et al. |
| 7,261,435 B2 | 8/2007 | Gould et al. |
| 7,267,461 B2 | 9/2007 | Kan et al. |
| 7,360,925 B2 | 4/2008 | Coushaine |
| 7,414,269 B2 | 8/2008 | Grotsch |
| 7,455,422 B2 | 11/2008 | Gould et al. |
| 7,456,499 B2 | 11/2008 | Loh |
| 7,481,552 B2 | 1/2009 | Mayfield et al. |
| 7,481,566 B2 | 1/2009 | Han |
| 7,530,716 B2 | 5/2009 | Mayfield et al. |
| 7,540,761 B2 | 6/2009 | Weber et al. |
| 7,549,786 B2 | 6/2009 | Higley et al. |
| 7,575,332 B2 | 8/2009 | Cok |
| 7,595,113 B2 | 9/2009 | Miyoshi |
| 7,604,365 B2 | 10/2009 | Chang |
| 7,654,703 B2 | 2/2010 | Kan et al. |
| 7,700,965 B2 | 4/2010 | Chang |
| 7,703,951 B2 | 4/2010 | Piepgras et al. |
| 7,712,926 B2 | 5/2010 | Matheson |
| 7,727,009 B2 | 6/2010 | Goto |
| 7,731,396 B2 | 6/2010 | Fay et al. |
| 7,744,266 B2 | 6/2010 | Higley et al. |
| 7,766,518 B2 | 8/2010 | Piepgras et al. |
| 7,806,562 B2 | 10/2010 | Behr et al. |
| 7,810,955 B2 | 10/2010 | Stimac et al. |
| 7,810,995 B2 | 10/2010 | Fadler et al. |
| 7,841,753 B2 | 11/2010 | Liu |
| 7,857,482 B2 | 12/2010 | Reo et al. |
| 7,866,847 B2 | 1/2011 | Zheng |
| 7,878,683 B2 | 2/2011 | Logan et al. |
| 7,918,589 B2 | 4/2011 | Mayfield et al. |
| 7,922,364 B2 | 4/2011 | Tessnow et al. |
| 7,923,907 B2 | 4/2011 | Tessnow et al. |
| 7,952,114 B2 | 5/2011 | Gingrich, III et al. |
| 7,961,113 B2 | 6/2011 | Rabiner et al. |
| 7,972,038 B2 | 6/2011 | Albright et al. |
| 7,988,336 B1 | 8/2011 | Harbers et al. |
| 7,997,758 B2 | 8/2011 | Zhang |
| 8,033,680 B2 | 10/2011 | Sharrah et al. |
| 8,052,310 B2 | 11/2011 | Gingrich, III et al. |
| 8,066,403 B2 | 11/2011 | Sanfilippo et al. |
| 8,076,683 B2 | 12/2011 | Xu |
| 8,113,680 B2 | 2/2012 | O'Brien et al. |
| 8,154,864 B1 | 4/2012 | Nearman et al. |
| 8,172,436 B2 | 5/2012 | Coleman et al. |
| 8,207,546 B2 | 6/2012 | Harada |
| 8,262,250 B2 | 9/2012 | Li |
| 8,297,788 B2 | 10/2012 | Bishop |
| 8,314,566 B2 | 11/2012 | Steele |
| 8,348,460 B2 | 1/2013 | Bachl |
| 8,371,723 B2 | 2/2013 | Nall |
| 8,434,897 B2 | 5/2013 | Logan et al. |
| 8,434,898 B2 | 5/2013 | Sanfilippo et al. |
| 8,449,128 B2 | 5/2013 | Ko |
| 8,454,193 B2 | 6/2013 | Simon et al. |
| 8,525,190 B2 | 9/2013 | Donofrio |
| 8,545,045 B2 | 10/2013 | Tress |
| 8,552,456 B1 | 10/2013 | Sun |
| 8,575,646 B1 | 11/2013 | Shum |
| 8,598,778 B2 | 12/2013 | Allen |
| 8,616,720 B2 | 12/2013 | Carney et al. |
| 8,697,458 B2 | 4/2014 | Nolan |
| 8,702,265 B2 | 4/2014 | May |
| 8,748,202 B2 | 6/2014 | Kwon |
| 8,764,220 B2 | 7/2014 | Chan et al. |
| 8,791,485 B2 | 7/2014 | Ohbayashi |
| 8,820,964 B2 | 9/2014 | Gould |
| 8,876,322 B2 | 11/2014 | Alexander |
| 8,876,325 B2 | 11/2014 | Lu et al. |
| 8,969,894 B2 | 3/2015 | Lee |
| 8,998,448 B2 | 4/2015 | Chang |
| 9,016,895 B2 | 4/2015 | Handsaker |
| 9,052,075 B2 | 6/2015 | Demuynck et al. |
| 9,157,622 B2 | 10/2015 | Yanping |
| 9,188,290 B2 | 11/2015 | Lay et al. |
| 9,285,085 B2 | 3/2016 | Carney et al. |
| 9,518,706 B2 | 12/2016 | Chan et al. |
| 9,605,812 B2 | 3/2017 | Van De Ven et al. |
| 9,651,227 B2 | 5/2017 | Pickard et al. |
| 9,666,772 B2 | 5/2017 | Ibbetson |
| 9,722,158 B2 | 8/2017 | Chan et al. |
| 9,874,333 B2 | 1/2018 | Lay et al. |
| 9,976,710 B2 | 5/2018 | Meir |
| 9,995,444 B2 | 6/2018 | Leichner |
| 10,030,828 B2 | 7/2018 | Meir |
| 10,100,988 B2 | 10/2018 | Rodgers et al. |
| 10,132,476 B2 | 11/2018 | Meir et al. |
| 10,228,099 B2 | 3/2019 | Meir |
| 10,378,705 B2 | 8/2019 | Meir |
| 10,465,864 B2 | 11/2019 | Leichner |
| 10,584,860 B2 | 3/2020 | Dungan et al. |
| 10,612,747 B2 | 4/2020 | Rodgers et al. |
| 2002/0117692 A1 | 8/2002 | Lin |
| 2003/0058658 A1 | 3/2003 | Lee |
| 2003/0072156 A1 | 4/2003 | Pohlert et al. |
| 2003/0198049 A1 | 10/2003 | Hulse |
| 2004/0070855 A1 | 4/2004 | Benitez |
| 2005/0092517 A1 | 5/2005 | Fan |
| 2005/0221518 A1 | 10/2005 | Andrews |
| 2005/0225985 A1 | 10/2005 | Catalano |
| 2005/0280016 A1 | 12/2005 | Mok |
| 2005/0286265 A1 | 12/2005 | Zampini et al. |
| 2006/0134440 A1 | 6/2006 | Crivello |
| 2006/0141851 A1 | 6/2006 | Matsui et al. |
| 2006/0146531 A1 | 7/2006 | Reo et al. |
| 2006/0187653 A1 | 8/2006 | Olsson |
| 2007/0064428 A1 | 3/2007 | Beauchamp |
| 2007/0092736 A1 | 4/2007 | Boardman |
| 2007/0103902 A1 | 5/2007 | Hsiao |
| 2007/0205425 A1 | 9/2007 | Harada |
| 2008/0048200 A1 | 2/2008 | Mueller |
| 2008/0080196 A1 | 4/2008 | Ruud |
| 2008/0144322 A1 | 6/2008 | Norfidathul |
| 2008/0165530 A1 | 7/2008 | Hendrikus |
| 2008/0244944 A1 | 10/2008 | Nall |
| 2008/0298058 A1 | 12/2008 | Can et al. |
| 2009/0021936 A1 | 1/2009 | Stimac et al. |
| 2009/0109539 A1 | 4/2009 | Devos |
| 2009/0167203 A1 | 7/2009 | Dahlman et al. |
| 2009/0195168 A1 | 8/2009 | Greenfield |
| 2009/0225546 A1 | 9/2009 | Pearson |
| 2009/0272996 A1 | 11/2009 | Chakraborty |

(56) References Cited

U.S. PATENT DOCUMENTS

| | | |
|---|---|---|
| 2009/0310354 A1 | 12/2009 | Zampini et al. |
| 2009/0321766 A1 | 12/2009 | Chang |
| 2010/0008090 A1 | 1/2010 | Li |
| 2010/0033948 A1 | 2/2010 | Harbers et al. |
| 2010/0060157 A1 | 3/2010 | Shi |
| 2010/0060202 A1 | 3/2010 | Melanson et al. |
| 2010/0072488 A1 | 3/2010 | Bierhuizen |
| 2010/0246179 A1 | 9/2010 | Long et al. |
| 2010/0254134 A1 | 10/2010 | McCanless |
| 2010/0308354 A1 | 12/2010 | David |
| 2011/0013387 A1 | 1/2011 | Kanade et al. |
| 2011/0025951 A1 | 2/2011 | Jones |
| 2011/0051394 A1 | 3/2011 | Bailey |
| 2011/0051407 A1 | 3/2011 | St. Ives et al. |
| 2011/0051425 A1 | 3/2011 | Tsuchiya |
| 2011/0062470 A1 | 3/2011 | Bierhuizen |
| 2011/0089453 A1 | 4/2011 | Min |
| 2011/0122643 A1 | 5/2011 | Spark et al. |
| 2011/0134634 A1 | 6/2011 | Gingrich, III et al. |
| 2011/0136374 A1 | 6/2011 | Mostoller et al. |
| 2011/0164426 A1* | 7/2011 | Lee ............... G02B 19/0061 362/335 |
| 2011/0193490 A1 | 8/2011 | Kumar |
| 2011/0198067 A1 | 8/2011 | Hada |
| 2011/0210364 A1 | 9/2011 | Nolan |
| 2011/0222270 A1 | 9/2011 | Porciatti |
| 2011/0255287 A1 | 10/2011 | Li |
| 2011/0280020 A1 | 11/2011 | Chen |
| 2011/0303935 A1 | 12/2011 | Chern |
| 2012/0002417 A1 | 1/2012 | Li |
| 2012/0025241 A1 | 2/2012 | Xiao |
| 2012/0025729 A1 | 2/2012 | Melanson et al. |
| 2012/0051048 A1 | 3/2012 | Smit et al. |
| 2012/0051056 A1 | 3/2012 | Derks et al. |
| 2012/0051068 A1 | 3/2012 | Pelton et al. |
| 2012/0087124 A1* | 4/2012 | Ravillisetty ............. F21V 13/08 362/235 |
| 2012/0106152 A1 | 5/2012 | Zheng et al. |
| 2012/0140474 A1 | 6/2012 | Jurik et al. |
| 2012/0250309 A1 | 10/2012 | Handsaker |
| 2012/0267650 A1 | 10/2012 | Schubert |
| 2013/0021797 A1* | 1/2013 | Kubo ............... A01G 7/045 362/235 |
| 2013/0063939 A1 | 3/2013 | Kondo |
| 2013/0083524 A1 | 4/2013 | Devorris |
| 2013/0134445 A1 | 5/2013 | Tarsa |
| 2013/0214691 A1 | 8/2013 | Chen |
| 2013/0265750 A1* | 10/2013 | Pickard ............... F21L 4/02 362/184 |
| 2013/0272000 A1 | 10/2013 | Pearson |
| 2013/0274398 A1 | 10/2013 | Shiobara et al. |
| 2013/0292709 A1 | 11/2013 | Tong |
| 2013/0313965 A1 | 11/2013 | Chiang |
| 2014/0001952 A1 | 1/2014 | Harris et al. |
| 2014/0036500 A1 | 2/2014 | Eggleton |
| 2014/0043812 A1 | 2/2014 | Moreau |
| 2014/0168997 A1* | 6/2014 | Lee ............... F21S 43/26 362/311.06 |
| 2014/0176016 A1 | 6/2014 | Li et al. |
| 2014/0177262 A1 | 6/2014 | Lai |
| 2014/0268720 A1 | 9/2014 | Dungan et al. |
| 2014/0268748 A1 | 9/2014 | Lay et al. |
| 2014/0268810 A1 | 9/2014 | Marquardt |
| 2014/0334142 A1 | 11/2014 | Levante |
| 2015/0034976 A1 | 2/2015 | Kim |
| 2015/0041839 A1 | 2/2015 | Sakai |
| 2015/0062965 A1* | 3/2015 | Oh ............... G02B 6/0073 362/311.02 |
| 2015/0117022 A1 | 4/2015 | Meir |
| 2015/0144918 A1 | 5/2015 | Cho |
| 2015/0145406 A1* | 5/2015 | Li ............... B29C 48/022 313/502 |
| 2015/0252982 A1 | 9/2015 | Demuynck |
| 2015/0276170 A1 | 10/2015 | Motoyanagi |
| 2015/0283768 A1 | 10/2015 | Marquardt |
| 2015/0316219 A1 | 11/2015 | Mallory |
| 2015/0326767 A1 | 11/2015 | Kim |
| 2016/0003424 A1 | 1/2016 | Wu |
| 2016/0035944 A1 | 2/2016 | Spanard |
| 2016/0076743 A1 | 3/2016 | Deutsch |
| 2016/0093780 A1 | 3/2016 | Beppu et al. |
| 2016/0195225 A1 | 7/2016 | Carney |
| 2016/0201861 A1 | 7/2016 | Meir |
| 2016/0327249 A1 | 11/2016 | Pearson |
| 2016/0327256 A1 | 11/2016 | Hall |
| 2017/0009957 A1 | 1/2017 | Lim et al. |
| 2017/0038015 A1 | 2/2017 | Lunz |
| 2017/0261186 A1 | 9/2017 | Meir et al. |
| 2017/0261187 A1 | 9/2017 | Meir |
| 2019/0219251 A1 | 7/2019 | Meir |
| 2019/0383450 A1 | 12/2019 | Meir |
| 2020/0096178 A1 | 3/2020 | Aviram |
| 2020/0141546 A1 | 5/2020 | Meir |
| 2020/0144468 A1 | 5/2020 | Meir |
| 2020/0191370 A1 | 6/2020 | Shohat |

FOREIGN PATENT DOCUMENTS

| | | |
|---|---|---|
| CN | 201590432 U | 9/2010 |
| CN | 201739849 U | 2/2011 |
| CN | 101997074 A | 3/2011 |
| CN | 202040752 U | 11/2011 |
| CN | 102269351 A | 12/2011 |
| EP | 0592746 B1 | 3/1997 |
| EP | 2474775 B1 | 11/2013 |
| EP | 2256833 B1 | 4/2014 |
| EP | 2484956 B1 | 6/2014 |
| GB | 2457016 A | 8/2009 |
| JP | 2011508406 | 3/2011 |
| JP | 2011204495 A | 10/2011 |
| JP | 2011204658 A | 10/2011 |
| KR | 1020070039683 A | 4/2007 |
| KR | 20090013704 A | 2/2009 |
| KR | 100974942 B1 | 8/2010 |
| KR | 1020120050280 A | 5/2012 |
| KR | 1020110106033 A | 6/2013 |
| WO | 2002015281 A2 | 2/2002 |
| WO | 2013059298 A1 | 4/2013 |
| WO | 2014082262 A1 | 5/2014 |
| WO | 2014099681 A2 | 6/2014 |
| WO | 2014099681 A3 | 12/2014 |
| WO | 2015066184 A1 | 5/2015 |
| WO | 2019213299 A1 | 11/2019 |

OTHER PUBLICATIONS

PCT/US2012/060588, International Application Serial No. PCT/US2012/060588, International Search Report and Written Opinion dated Mar. 29, 2013, Ecosense Lighting Inc. et al, 10 pages.

PCT/US2012/060588, "International Application Serial No. PCT/US2012/060588, International Preliminary Report on Patentability and Written Opinion dated May 1, 2014", Ecosense Lighting Inc. et al, 7 Pages.

PCT/US2013/075172, "International Application Serial No. PCT/US2013/075172, International Search Report and Written Opinion dated Sep. 26, 2014", Ecosense Lighting Inc., 16 Pages.

International Search Report and Written Opinion dated Nov. 27, 2013 in PCT Application No. PCT/US2013/045708.

PCT/US2014/062905, International Preliminary Report on Patentability dated May 3, 2016 (7 pp).

PCT/US2014/062905, Written Opinion of the Int'l Searching Authority dated Jan. 22, 2015 (6 pp).

* cited by examiner

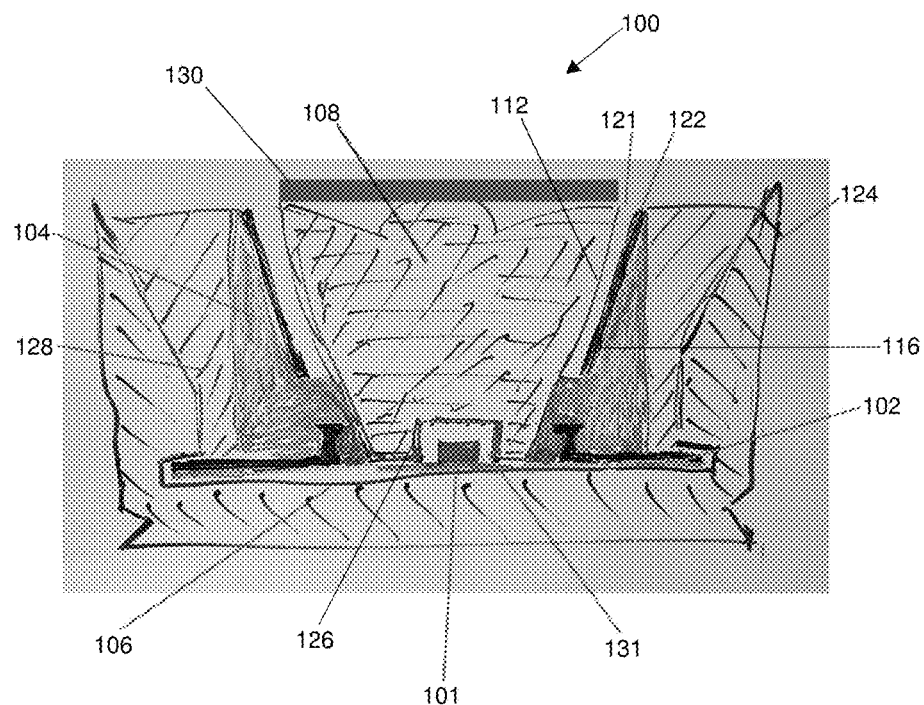
FIG. 1
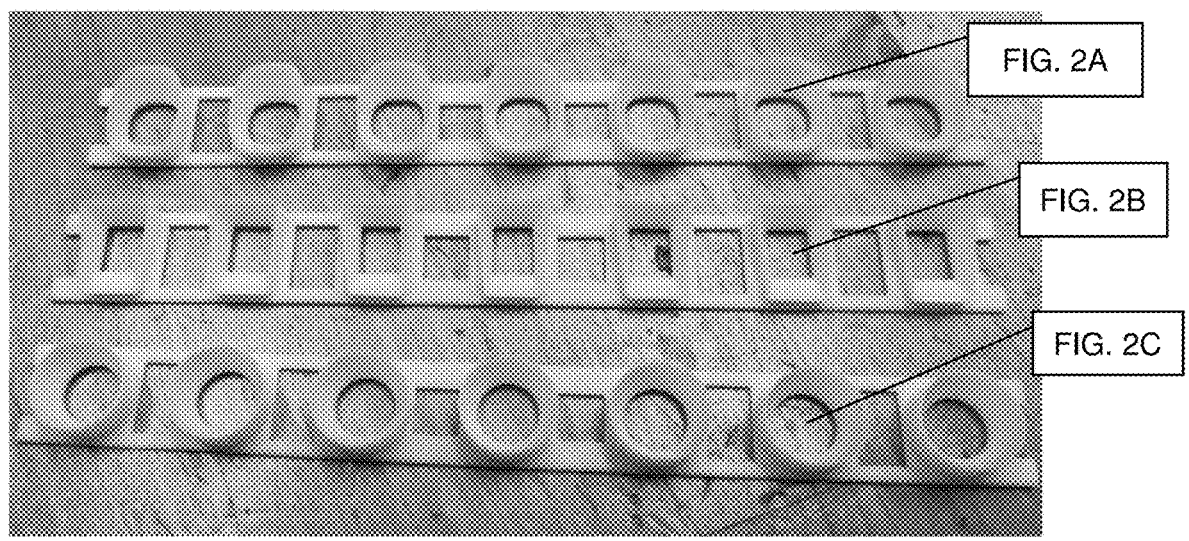

LIGHTING SYSTEMS AND DEVICES WITH CENTRAL SILICONE MODULE

CROSS-REFERENCE TO RELATED APPLICATIONS

This application claims priority to each of U.S. Provisional Application Ser. No. 62/665,197, titled "Lighting Devices with Central Silicone Module" filed on May 1, 2018 and U.S. Provisional Application Ser. No. 62/681,490, titled "Lighting Devices with Central Silicone Module" filed on Jun. 6, 2018, both of which are incorporated herein by reference in their entireties.

FIELD

The invention relates generally to lighting and, more particularly, to lighting systems (e.g., strip lighting systems) that include an LED and a central silicone module (CSM) designed to contain a lens that receives light emitted by the LED.

BACKGROUND

Light emitting diodes (LEDs) are typically formed from a semiconductor material that is doped to create a p-n junction. The LEDs typically emit light in a narrow spectrum (e.g., a spectrum that is smaller 100 nanometers in size) that is dependent upon the bandgap energy of the semiconductor material that forms the p-n junction.

In some application, lighting systems may include one or more optical component that receives light emitted from an LED. For example, a lens is a type of optical component that may be used to receive light emitted from an LED and adjust one or more characteristics of the light.

SUMMARY

Lighting systems that include an LED and a central silicone module (CSM) designed to contain a lens are described herein.

In one aspect, a lighting system is provided. The system comprises a circuit board and a light emitting diode (LED) mounted to one side of the circuit board and configured to emit light. The system further comprises a lens disposed over the LED and having a bottom surface facing the one side of the circuit board. The lens has a top surface opposite the bottom surface and a lateral surface between the top and bottom surfaces. The lighting system further comprises a central silicone module (CSM) constructed, at least in part, from silicone and disposed on the one side of the circuit board. The CSM is configured to receive the lens and hold the lens over the LED without being in contact with at least part of the lateral surface of the lens so as to form a gap.

In some embodiments, the system further comprises an elastomer encapsulating, at least in part, the circuit board and the CSM.

In some embodiments, the central silicon module comprises a reflective silicone. For example, the reflective silicone may have a reflectance of at least 95% for visible light. In some cases, the reflective silicone may have a reflectance of at least 95% for light having a wavelength of 5 mils. In some embodiments, the silicone has a material reflectivity of at least 90% and, in some cases, at least 95%.

In some embodiments, the silicone comprises titanium oxide ($TiO_2$) particles. For example, a concentration of $TiO_2$ particles in the silicone is between 3% and 10%.

In some embodiments, the CSM comprises a base in contact with the one side of the circuit board and at least one guiding hall attached to the base and configured to hold the lens above the LED.

In some embodiments, the CSM is a monolithic element.

In some embodiments, the lighting system further comprises a tray configured to receive the circuit board and wherein the elastomer is in contact with at least part of the tray.

In some embodiments, the lens is constructed, at least in part, from silicone.

In some embodiments, the CSM is in contact with a first portion of the lateral surface of the lens and not in contact with a second portion of the lateral surface of the lens. The first portion of the lateral surface of the lens is closer to the circuit board than the second portion of the lateral surface of the lens.

In some embodiments, the lighting system further comprises a reflector disposed in the gap and in contact with the CSM.

In some embodiments, the gap is an air gap.

In some embodiments, an optical efficiency of the lighting system is at least 88% and wherein the optical efficiency of the lighting system is a ratio between a light output of the LED alone relative to a light output by the entire lighting system under a same power and temperature condition. In some cases, the optical efficiency is at least 92%.

In some embodiments, the lighting system is a strip lighting system.

In some embodiments, the CSM includes a cup configured to receive the lens.

In some embodiments, the CSM includes a series of cups configured to respectively receive a series of lenses.

In some embodiments, the lighting system further comprising potting material.

In some embodiments, the CSM, the lens, the reflector, and the potting material provide a continuous combination of material. In some embodiments, the CSM, the lens, the reflector, and the potting material all comprise silicone.

Other aspects, embodiments and features will become apparent from the following non-limiting detailed description when considered in conjunction with the accompanying drawings, which are schematic and which are not intended to be drawn to scale. In the figures, each identical or nearly identical component that is illustrated in various figures typically is represented by a single numeral. For purposes of clarity, not every component is labeled in every figure, nor is every component of each embodiment shown where illustration is not necessary to allow those of ordinary skill in the art to understand the invention. In cases where the present specification and a document incorporated by reference include conflicting disclosure, the present specification shall control.

BRIEF DESCRIPTION OF DRAWINGS

FIG. 1 shows a cross-sectional view of a lighting system including a central silicone module (CSM) according to some embodiments of the technology described herein.

FIGS. 2A-2C show respective top views of different CSMs according to some embodiments of the technology described herein.

DETAILED DESCRIPTION

Lighting systems that include an LED and a central silicone module (CSM) designed to contain a lens are described herein. The lens can be configured to receive light emitted from the LED and adjust one or more characteristics of the light. As described further below, the CSM may be designed to provide high lighting reflectance and a robust structure. In some embodiments, the CSM is designed to contain a series of lenses that are positioned above a series of LEDs. In such embodiments, the lighting system may be implemented as a strip lighting system having a length (e.g., approximately six inches), a width that is less than the length (e.g., approximately one inch), and a height that is less than the width (e.g., approximately half an inch). In some embodiments, the strip lighting system comprises a plurality of LEDs as well as corresponding lenses that are spaced along the length of the strip lighting systems (e.g., the LEDs may be spaced apart by approximately one inch). Strip lighting systems may have a construction similar to those described in U.S. Pat. Nos. 9,976,710 and 10,132,476 both of which are incorporated herein by reference in its entirety.

Figure 6:
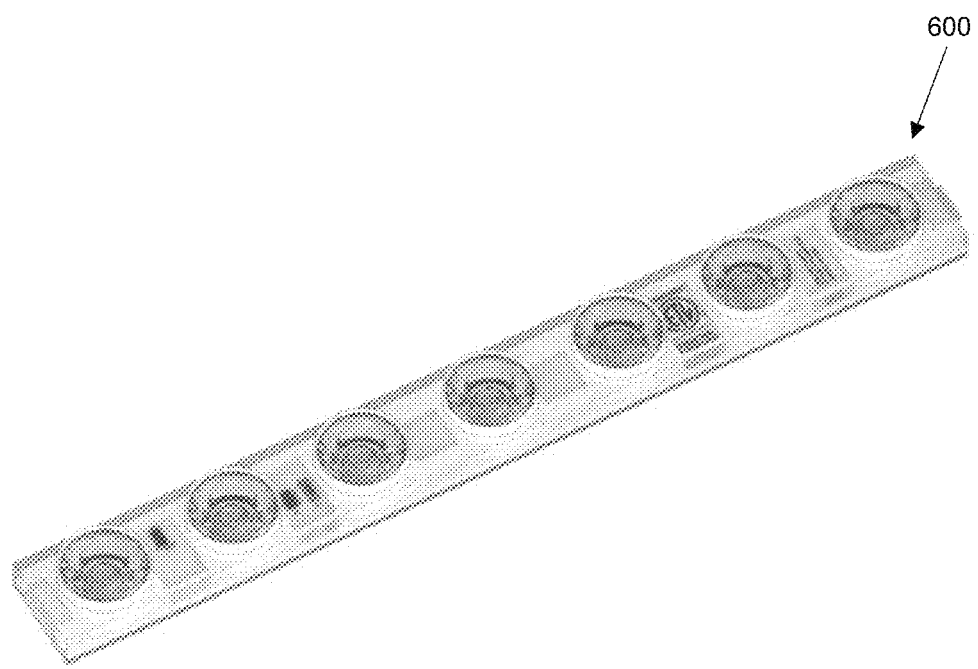
FIG. 6 shows an example of a strip lighting system according to some embodiments.

FIG. 1 shows a cross-sectional view of a portion of lighting system 100. As shown, the system includes an LED 101 that is positioned on a circuit board 102. Though FIG. 1 shows only a single LED, it should be understood that in systems that include a series of LEDs and corresponding lenses (e.g., strip lighting systems), the structure shown in the cross-section of FIG. 1 may be similar or the same surrounding each LED in the series (e.g., along the strip). FIG. 6 shows an example of a strip lighting system 600 according to some embodiments.

The system includes a central silicone module (CSM) 104 that is mounted on the circuit board in an area outside the periphery of the LED. In the illustrative embodiment, the system includes an optional base 106 for facilitating mounting the CSM in a proper location relative to the circuit board and LED. For example, the CSM and/or base may include alignment features that ensure proper positioning of the CSM relative to the circuit board and the LED. In other embodiments, the system does not include a separate base and the CSM may include, or be associated with, alignment features (e.g., bumps, pins, etc.) that may be positioned within corresponding features (e.g., guiding halls) on the circuit board to correctly position the CSM relative to the circuit board and the LED.

A lens 108 for receiving light emitted from the LED is positioned within the CSM such that a surface of the lens is in contact with a surface of the CSM. For example, as shown, a lower portion of a lateral surface 112 of the lens may be in contact with a lower portion of a wall 116 of the CSM. In the illustrative embodiment and as described further below, an upper portion of the wall of the CSM is not in contact with an upper portion of the lateral surface of the lens so that a gap 121 is formed between the CSM and the lens. A reflector 122 may be positioned within the gap. As shown, the reflector 122 is not in contact with the lens to maintain space (i.e., air) between the reflector and the lens. In the system shown in FIG. 1, the reflector is on the wall of the CSM. Some embodiments do not include a separate reflector and rely on the CSM surface for reflecting light (e.g., back into the lens).

As shown, the lighting system comprises a tray 124 with a channel 126 into which the circuit board may be inserted. Once the circuit board has been inserted into the tray and the CSM is mounted on the circuit board, potting material 128 may be added to fill the remaining space between the tray and CSM. In such embodiments, the potting material may be contact with the circuit board, the tray, and/or the CSM.

In some embodiments, an optional cover 130 is provided on top of the lens(es). The cover may prevent contaminants (e.g., water, debris) from effecting performance of the lens and system. It should be understood that not all embodiments include a lens cover.

It should be appreciated that the embodiments described herein may be implemented in any of numerous ways. Examples of specific implementations are provided herein for illustrative purposes only. It should be appreciated that these embodiments and the features/capabilities provided may be used individually, all together, or in any combination of two or more, as aspects of the technology described herein are not limited in this respect.

As described above, the lighting systems include a Central Silicone Module (CSM). In general, the CSM is configured to contain the lens(es) that are used in the system. The CSM may be constructed to have a shape appropriate to contain the type(s) of lens(es) of the system. For example, when assembled, the lens(es) may be attached to the CSM using an adhesive (e.g., silicone adhesive).

Figure 3:
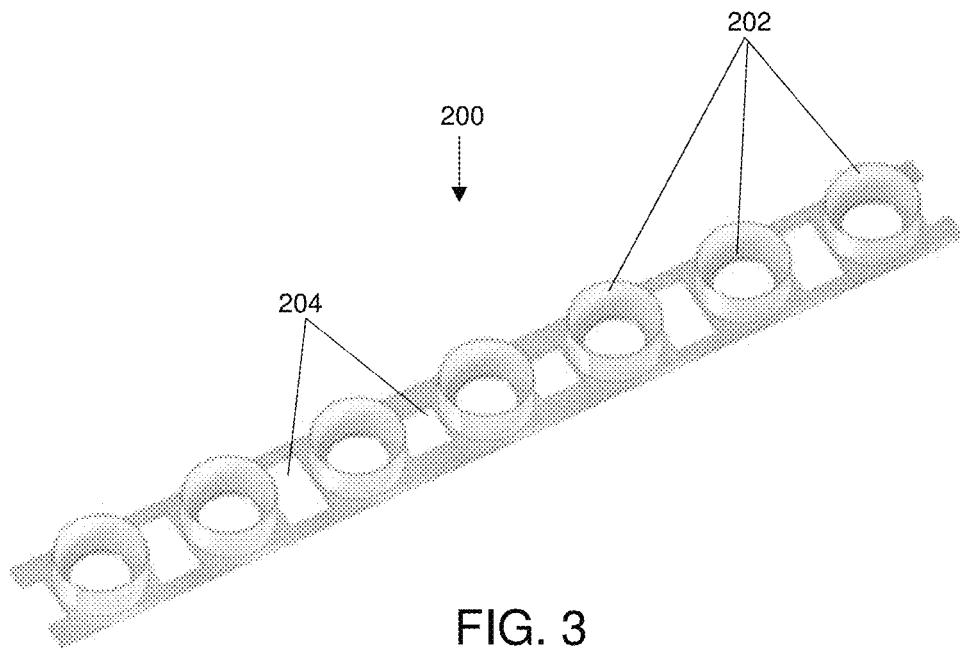
FIG. 3 shows a perspective view of a CSM according to some embodiments of the technology described herein.
Figure 4:
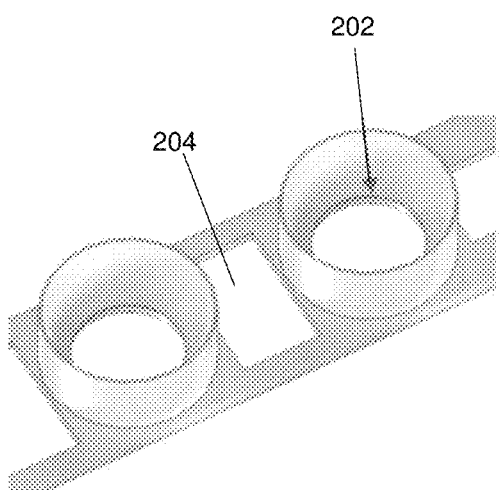
FIG. 4 shows a magnified view of a portion of the CSM of FIG. 3 according to some embodiments of the technology described herein.
Figure 5:
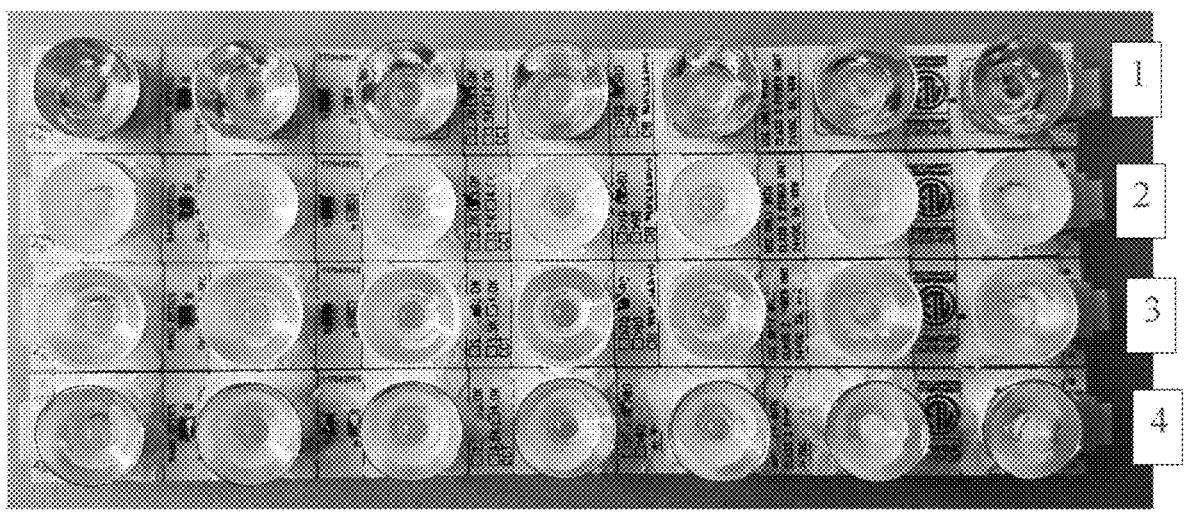
FIG. 5 shows an image of the samples during testing as described in Example 1.

FIG. 3 shows a perspective view of a CSM 200 that may be used in a strip lighting system and FIG. 4 shows a magnified view of a portion of the CSM shown in FIG. 3. In the illustrative embodiment, the CSM includes a series of cups 202 (also may be referred to as "halls") that are shaped to contain corresponding lens. As shown, the CSM includes seven cups. It should be understood that other embodiments may include a different numbers of cups. In this embodiment, each cup has a similar shape to contain the same type of lens. In other embodiments, the CSM may have cups of different shapes, for example, when different types of lenses are used in the same system. For example, FIGS. 2A-2C are images of CSMs that have different types of cups.

It should be understood that the CSM may have a different configuration if used in a different lighting system. For example, if the lighting system is not a strip lighting system and, for instance, includes a single lens then the CSM may have a single cup.

In general, the cup(s) may have any suitable design as needed for different types of lenses. As shown, the cups can have an aperture that may extend from a top surface of the cup to a bottom of the cup (i.e., the cup surface closest to the circuit board when assembled). The aperture is defined by sidewalls of the cup. In some cases, as described further below, the cup sidewalls are angled (e.g., outwardly tapered from the bottom surface to the top surface). In other embodiments, the cup sidewalls may be straight. In some embodiments, the cup sidewalls may include both an angled section and a straight section when progressing from the bottom surface to the top surface. In some embodiments, and as shown in FIG. 1, the cup sidewall includes a lateral section which extends substantially planar to the circuit board. The lateral section may be between two angled sections, as shown.

As noted above, the cups are designed to contain lens(es). The shape of the lens used can determine the shape of the cup. In some embodiments, the cups may have one design for a narrow lens which is different than the design for an oval lens which is different than the design for an assymetric lens. The cup may have a cross-section parallel to the plane of the circuit board which is circular, oval, rectangular, square or otherwise shaped.

In some embodiments, the cup(s) are designed such that only a portion of the lateral lens surface is in contact with walls of the cup. In such embodiments, other portions of the lateral lens surface may be separated from the walls of the cup by a gap. For example, as described above and shown in FIG. 1, a lower portion of lateral surface 112 of the lens is in contact with a lower portion of wall 116 of the CSM (e.g., up to 3 mm in vertical distance from bottom of lens surface), while upper portion of the CSM wall is not in contact with upper portion of the lateral surface of the lens so that gap 122 (e.g., air gap) is formed between the CSM and the lens. The gap may promote total internal reflection (TIR), while the contact between the CSM and the lens may promote diffusive reflectivity. In such embodiments, as shown in FIG. 3, the cross-sectional area of the cup aperture may be smaller at the bottom of the cup and larger at the top of the cup.

The CSM may include one or more apertures 204. For example, the apertures may be formed adjacent some (or every) of the cups. The apertures may be provided to enable access (e.g., visual access and/or physical access) to a component (e.g., the circuit board) that underlies the CSM. In general, the aperture(s) may have any suitable configuration. It should be understood that not all embodiments utilize apertures in the CSM.

As described above, the CSM comprises a silicone material. In some embodiments, the CSM is formed primarily (e.g., greater than 50% by weight, greater than 70% by weight, greater than 90% by weight) or essentially entirely of silicone. In some embodiments, the CSM may consist essentially of a silicone material. In some embodiments, additives (e.g., particles) may be added to the silicone material of the CSM to impart desirable properties (e.g., reflectivity). For example, titanium dioxide ($TiO_2$) may be added to the silicone material. In some embodiments between 3-10 weight percent titanium dioxide may be added.

In some embodiments, the silicone may be highly reflective. In some such embodiments, the silicone may have a white reflective color (e.g., white silicone). Suitable silicones include CI-2001 (Dow Corning) and MS-2002 (Dow Corning). In some embodiments, the reflective silicone may have a reflectance of at least 93% for light in the visible region. In some cases, the reflective silicone may have a reflectance of at least 95% for light in the visible region. In some embodiments, the silicone has a material reflectivity of at least 90% and, in some cases, at least 95%.

In some embodiments, the CSM may include alignment features (e.g., bumps, pins, protrusions, etc.) that may be formed on a bottom surface of the CSM (i.e., surface closest to the circuit board when the system is assembled). The alignment features may be positioned within corresponding features (e.g., guiding halls) on the circuit board or base (when present) to correctly position the CSM relative to the circuit board and LED.

It is optional to have a portion of the CSM made from light absorbing material (e.g., black Silicone, which has a very low reflectivity <50% or <30%) to eliminate the unwanted stray light which may be scattered out at unwanted direction.

In some embodiments, the CSM may be made form a combination of high reflective material and low reflective material. For example, the CSM may comprise high reflective silicon at the section of the CSM which is in contact with the lens (e.g., up to 3 mm) and the CSM may comprise low reflective silicone (e.g., black silicone) at the section of the CSM which is not in contact with the lens (e.g., above 3 mm for example).

In general, LED 101 may have any suitable design. For example, the LED may be a semiconductor device that is configured to emit light. The light emitted from the LED may have an angular CCT deviation such as a phosphor converted LED. The LED is mounted to a circuit board as described further below.

In general, circuit board 102 may have any suitable design and configuration. The circuit board may be, for example, a flexible printed circuit board (PCB) (e.g., an FR4 PCB) to allow the lighting system to bend without breaking. Various electrical components as needed for the operation of the lighting system may be mounted on the circuit board.

As described above, the system may (or may not) include base 106 for facilitating mounting the CSM on the circuit board. In some embodiments, the base comprises one or more features (e.g., lip) that engages with feature(s) on the CSM such that the CSM is held in place by the base. In some embodiments, the base includes (and/or is associated with) one or more additional features (e.g., tabs) to facilitate mounting the base on a circuit board. For example, the features may be affixed to the circuit board using through holes in the circuit board.

In general, lens 108 may have any suitable design. The lens may be, for example, a monolithic lens constructed from any of a variety of materials such as silicone, glass, and/or a plastic (e.g., acrylic or polycarbonate). The lens may omit scattering particles and/or phosphors. The lens may be a narrow-shaped lens, an oval-shaped lens, a rectangular-shaped lens, an asymmetric-shaped lens, amongst other shapes. Suitable lenses have been described in U.S. Pat. No. 10,132,476 which is incorporated herein by reference in its entirety.

The lens comprises a cavity 131 that is configured to receive the LED and provide a gap (e.g., an air gap) between the LED and the lens. In some embodiments, it is important that the cavity is sealed so as to maintain the gap and prevent any material (e.g., potting material) from contacting the LED surface.

The lens may be configured to receive light from the LED and reduce the angular CCT deviation of the received light. For example, the lens may mix the light received from the LED to make the color temperature more uniform and collimate the mixed light to form a beam. The lens may receive light from the LED through a bottom surface and emit light through a lateral surface of the lens. As described further below, light emitted through a lateral surface of the lens may be reflected by the reflector back into the lens. Then, the light in the lens may be emitted through the top surface of the lens.

In general, the reflector (when present) may have any suitable design. The reflector may be configured to reflect light that leaves a lateral surface of the lens back into the lateral surface of the lens. For example, the reflector may comprise a reflective surface that faces the lens and reflects light that leaves a lateral surface of the lens back into the lens. Thereby, the light in the lens may be emitted through the top surface of the lens. The reflective surface may be configured to provide diffuse and/or specular reflection. The reflector may be, for example, a monolithic reflector constructed from a plastic (e.g., acrylic or polycarbonate) coated in a material such as a paint or a metal to achieve the desired reflection (e.g., diffuse and/or specular reflection). In some embodiments, the reflector may be a reflective coating on the CSM.

It should be understood that not all embodiments include a separate reflector. In such embodiments, the system may rely on the CSM, itself, for reflecting light (e.g., back into the lens).

As described above, gap 122 may be provided between the lateral surface of the lens and a reflective surface of the reflector (and/or CSM). The gap may be left unfilled to form an air gap which may be preferred in certain embodiments. Alternatively, the gap may be filled with a material, for example, to keep debris from entering the gap. In some embodiments, the material employed to fill the gap may have a refractive index that is lower than or similar to the refractive index of the lens to operate similarly to an air gap.

In some embodiments, an optional cover 130 is provided on top of the lens(es). The cover may prevent contaminants (e.g., water, debris) from effecting performance of the lens and system. In some embodiments, the surface of the cover may be separated from the lens surface by a gap. In some embodiments, the cover has a planar surface which does not deflect the light beam emitted from the lens. For example, the planar lens surface may match the lens outer boundaries but may be separated from the lens by a gap.

In some embodiments, the cover may be placed over the lens(es) and the CSM, or only over the lens(es). In some embodiments that include multiple lenses (e.g., strip lighting systems) a single cover may cover multiple lenses; in other such embodiments, each lens may have an individual cover. The cover may be shaped to fit a top surface of the lens. The cover may be attached to the cup and/or CSM using an adhesive (e.g., clear silicone adhesive). In some cases, the cover may be attached using potting material that is otherwise used in the system.

It should be understood that not all embodiments include a cover.

As described above, the lighting system comprises tray 124 which includes channel 126 into which the circuit board may be inserted. In general, the tray may have any suitable design and construction. In some embodiments, the tray may be constructed from an elastomer such as silicone. Thereby, the circuit board may be at least partially encapsulated with an elastomer. In some embodiments, the tray, CSM and potting material may all be constructed from silicone As shown, the tray includes sidewalls and a bottom surface which define the sidewalls and bottom surface of the lighting system. It should be understood that other embodiments may have tray configurations and other embodiments may not include a tray.

In general, any suitable pottering material 128 may be used in the lighting system. In some embodiments, the potting material may comprise an elastomer such as silicone. The elastomer (e.g., silicone) may be transparent so that printing or other information on the circuit board may be readily viewed.

In general, any suitable technique may be used to manufacture the lighting systems and components described herein. In some embodiments, the CSM is made by a (silicone) injection molding process. In some embodiments, the lens is made by a (silicone) molding process. In some embodiments, the tray is made using a (silicone) extrusion process. In some embodiments, the cover is made from a (silicone) injection molding process.

In some embodiments, component tolerances may be important to optimize performance (e.g., optical efficiency, beam shape, consistency of each beam divergence and illumination uniformity (intensity and color) of the lighting system.

The following Example is intended to be an illustrative embodiment and is not intended to be limiting.

EXAMPLE

Strip lighting system samples including an LED were produced and evaluated to assess some of the features of the technology described herein.

Sample 1 included a lens (narrow lens) positioned above the LED but did not include a CSM.

Sample 2 included a CSM (made of white reflective silicone) and a lens (narrow lens) with no separation between the CSM and the lens.

Sample 3 included a CSM (made of white reflective silicone) and a lens (narrow lens) with the CSM contacting the lens for a vertical height of 3 mm and the CSM being separated from the lens above the height of 3 mm to provide an air gap (similar to structure shown in FIG. 1). The sample included a separate white reflector.

Sample 4 included a CSM and a lens (narrow lens) with the CSM contacting the lens for a vertical height of 3 mm and the CSM being separated from the lens above the height of 3 mm to provide an air gap (similar to structure shown in FIG. 1). The sample included a separate white reflector with an Al coating.

Each sample included a similar LED, lens and other conventional components.

The following table summarizes the results obtained. Samples 3 and 4 had excellent performance including efficiency.

| | Flux (lm) | Eff. (lm/W) | x | y | Tc (K) | Ra | R9 |
|---|---|---|---|---|---|---|---|
| 1 | 190.8 | 77.5 | 0.4465 | 0.4154 | 2935 | 83.5 | 10 |
| 2 | 216.1 | 87.8 | 0.4474 | 0.4158 | 2925 | 83.6 | 10 |
| 3 | 226.4 | 92.2 | 0.4457 | 0.4143 | 2939 | 83.6 | 10 |
| 4 | 222.6 | 90.1 | 0.4450 | 0.4130 | 2940 | 83.7 | 11 |

FIG. 6 shows an image of the samples during testing. From the image it is clear that Sample 2 does not provide any TIR which results in relatively low efficiency.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:

1. A lighting system comprising:
   a circuit board;
   a light emitting diode (LED) mounted on a side of the circuit board and configured to emit light;
   a lens being located in a position over the LED, the lens having a bottom surface facing the side of the circuit board, and having a top surface opposite the bottom surface, and having a lateral surface spanning a distance between the top and bottom surfaces; and
   a central silicone module including silicone and being disposed on the side of the circuit board and being configured for holding the lens in the position over the LED, the central silicone module having a module surface facing toward the lateral surface of the lens, a first portion of the module surface spanning a first portion of the distance and being spaced apart away from the lateral surface for the first portion of the distance to form a gap, and a second portion of the module surface spanning a second portion of the distance and being received into contact with the lateral surface for the second portion of the distance, the second portion of the module surface being located between the side of the circuit board and the first portion of the module surface.

2. The lighting system of claim 1, wherein the central silicone module includes a cup forming the module surface, and wherein the second portion of the module surface of the cup is shaped for receiving into contact, and for holding in the position over the LED, the lateral surface of the lens for the second portion of the distance.

3. The lighting system of claim 2, wherein the first portion of the module surface of the cup is shaped for receiving and forming the gap together with the lateral surface of the lens for the first portion of the distance.

4. The lighting system of claim 1, wherein the gap is an air gap.

5. The lighting system of claim 1, wherein the gap is at least partially filled with a visible-light—transmissive material.

6. The lighting system of claim 5, wherein the visible-light—transmissive material has a lower refractive index than another refractive index of the lens.

7. The lighting system of claim 1, further including a reflector located in the gap, the reflector having a reflective surface facing toward the lateral surface of the lens.

8. The lighting system of claim 7, wherein the reflective surface is configured to reflect at least some light toward the lateral surface of the lens and back into the lens.

9. The lighting system of claim 1, further including a potting material, wherein the central silicone module is located between the potting material and the lateral surface of the lens.

10. The lighting system of claim 9, wherein the potting material includes an elastomer.

11. The lighting system of claim 1, wherein the LED is a phosphor converted LED that emits light with an angular correlated color temperature (CCT) deviation.

12. The lighting system of claim 11, wherein the lens is configured to receive the light emitted from the phosphor converted LED and to reduce the angular CCT deviation of the light received from the phosphor converted LED.

13. A lighting system, comprising:
    a circuit board;
    a lens assembly including a lens having a light output surface being spaced apart along a central axis from a light input surface, the lens further having a lateral surface being spaced apart around the central axis and having a frusto-conical shape spanning a distance between the light input and output surfaces of the lens, the lens being configured for causing some light passing into the lens through the light input surface to be diverted toward the lateral surface;
    a light source being located on a side of the circuit board, the lens being located with the light input surface as being located in a position over the light source, the light source including a light emitting diode (LED) and being configured for generating light being directed through the light input surface into the lens;
    a central silicone module including silicone and being disposed on the side of the circuit board and being configured for holding the lens with the light input surface as being in the position over the light source, the central silicone module having a module surface facing toward the lateral surface of the lens, a first portion of the module surface spanning a first portion of the distance and being spaced apart away from the lateral surface for the first portion of the distance to form a gap, and a second portion of the module surface spanning a second portion of the distance and being received into contact with the lateral surface for the second portion of the distance, the second portion of the module surface being located between the side of the circuit board and the first portion of the module surface.

14. The lighting system of claim 13, wherein the central silicone module includes a cup forming the module surface, and wherein the second portion of the module surface of the cup is shaped for receiving into contact, and for holding in the position over the LED, the lateral surface of the lens for the second portion of the distance.

15. The lighting system of claim 14, wherein the first portion of the module surface of the cup is shaped for receiving and forming the gap together with the lateral surface of the lens for the first portion of the distance.

16. The lighting system of claim 13, further including a reflector located in the gap, the reflector having another frusto-conical shape, the reflector being spaced apart around the central axis and spanning a portion of the distance between the light input and output surfaces of the lens, the reflector having a reflective surface facing toward the lateral surface of the lens.

17. A lighting process, comprising:
    providing a lighting system that includes a circuit board, a lens assembly, a light source, and a central silicone module, the lens assembly including a lens having a light output surface being spaced apart along a central axis from a light input surface, the lens further having a lateral surface being spaced apart around the central axis and having a frusto-conical shape spanning a distance between the light input and output surfaces of the lens, the light source being located on a side of the circuit board, the lens being located with the light input surface as being in a position over the light source, the light source including a light emitting diode (LED), the central silicone module including silicone and being disposed on the side of the circuit board and being configured for holding the lens with the light input surface as being in the position over the light source, the central silicone module having a module surface facing toward the lateral surface of the lens, a first portion of the module surface spanning a first portion of the distance and being spaced apart away from the lateral surface for the first portion of the distance to form a gap, and a second portion of the module surface spanning a second portion of the distance and being received into contact with the lateral surface for the second portion of the distance, the second portion of the module surface being located between the side of the circuit board and the first portion of the module surface;

causing the light source to generate light being directed through the light input surface into the lens;

causing the lens to divert, to the lateral surface, some light after passing into the lens through the light input surface; and causing some light after being diverted to the lateral surface to then be further diverted into the lens thereby reducing an angular correlated color temperature deviation of the light emissions.

18. The lighting process of claim 17, wherein providing the central silicone module includes providing a cup as forming the module surface, and wherein providing the lighting system as being configured for holding the lens with the light input surface as being in the position over the light source includes selecting the central silicone module with the second portion of the module surface of the cup as being shaped for receiving into contact, and for holding in the position over the LED, the lateral surface of the lens for the second portion of the distance.

19. The lighting process of claim 18, wherein providing the lighting system includes selecting the central silicone module with the first portion of the module surface of the cup as being shaped for receiving and forming the gap together with the lateral surface of the lens for the first portion of the distance.

20. The lighting process of claim 17, wherein providing the lighting system includes providing a reflector located in the gap, the reflector having another frusto-conical shape, the reflector being spaced apart around the central axis and spanning a portion of the distance between the light input and output surfaces of the lens, the reflector having a reflective surface facing toward the lateral surface of the lens; and wherein the reflector causes some light after being diverted to the lateral surface of the lens to then be further diverted by the reflector into the lens thereby reducing an angular correlated color temperature deviation of the light emissions.

* * * * *